United States Patent [19]

Annunziata et al.

[11] Patent Number: 4,551,671

[45] Date of Patent: Nov. 5, 1985

[54] TERMINAL DISCONNECT AND MEDIA WIRE FAULT DETECT MECHANISM

[75] Inventors: Eugene J. Annunziata; Thomas E. Stammely, both of Cary, N.C.

[73] Assignee: International Business Machines Corp., Armonk, N.Y.

[21] Appl. No.: 507,252

[22] Filed: Jun. 23, 1983

[51] Int. Cl.⁴ .............................................. G01R 31/02
[52] U.S. Cl. ....................................................... 324/51
[58] Field of Search ................................. 324/51, 52; 179/175.2 C, 175

[56] References Cited

U.S. PATENT DOCUMENTS 3,812,303  5/1974  Stewart .............................. 324/51 X
4,204,241  5/1980  Yang ................................. 179/175 X Primary Examiner—Stanley T. Krawczewicz
Attorney, Agent, or Firm—Joscelyn G. Cockburn

[57] ABSTRACT

A device, method and system for testing in situ the wiring between a data terminal equipment and a ring or similar type local area network having a loop conduction path with a plurality of data terminal equipment (DTE) coupled to said loop conduction path. The DTE is provided with a mechanism for generating d.c. current. The d.c. currents flow from the DTE through a length of interconnecting conductors and self-shorting connectors towards the loop conduction path. Current measuring devices monitor the current at the interconnecting conductors for imbalance current flow and/or over current. The presence of either a current imbalance and/or over current indicates a malfunctioning (short circuit, broken wire, etc.) in the wiring.

14 Claims, 5 Drawing Figures

TERMINAL DISCONNECT AND MEDIA WIRE FAULT DETECT MECHANISM

BACKGROUND OF THE INVENTION (1) Field of the Invention

The invention relates to electrical test apparatus in general and more particularly to electrical test apparatus for testing the wiring of a ring type local area network (LAN) for short circuit, broken wire, terminal disconnect, etc.

(2) Prior Art

The use of LAN for transmitting data within a building or group of buildings is well known in the prior art. When transmission occurs between buildings, it is necessary that the buildings be positioned in close proximity. Usually the LAN consists of a wiring system to which a plurality of machines, hereinafter called Data Terminal Equipment (DTE), are connected.

The topology of the wiring system consists of a backbone or main ring formed from looped conductors and a plurality of interconnecting conductors tapped onto the main ring. The DTE's are coupled to the interconnecting conductors.

As with any type of wiring system, the aforementioned LAN is susceptible to wire fault. Such faults may be broken wires, unplugged terminals, short circuits, etc. The faults may occur during installation or develop after the wire is installed. In order to detect faults which may occur at installation and faults which may occur thereafter, the testing apparatus must be an integral part of the LAN. The testing apparatus must also be able to test for in situ fault.

The prior art discloses test devices suitable for testing multiconductor cable for continuity, correct connections, and the absence of short circuits between conductors. U.S. Pat. No. 3,982,180 is an example of such prior art. In the patent, each end of the cable to be tested is connected to terminating contacts. A structure consisting of a plurality of zener diodes is connected to one of the terminating contacts. The diodes have dissimilar zener breakdown voltages and are poled in the same sense in respect to a common junction point. The connection is such that a diode is coupled to one conductor in the cable. A test circuit is connected to the other terminating contact. The connection is such that at any instant a single conductor is placed in series with the other conductors collectively, a resistor, a current meter, and a DC voltage source. The voltage source is poled so as to cause the zener diode connected at the opposite end of the single conductor to have a zener breakdown when that conductor is continuously correctly connected and not short circuited to another conductor. The breakdown causes a unique reading of the meter. When the single conductor is non-continuous, incorrectly connected or shorted to another conductor, other meter indications are produced.

U.S. Pat. No. 3,983,338 is another example of the prior art testing devices. The testing device tests the operability of an electrical service line, such as a telephone service line, or other low voltage service line, between a test station and a telephone service installation or other electrical equipment connected to the line. An electrical device is connected to the line at the service installation. An electrical signal is transmitted from a test station to the electrical device. The electrical signal is selectively modified, by the electrical device, and returned to the test station. The modification is such that the test station can ascertain the operability of the line and/or the presence or removal of the telephone set or other electrical equipment connected to the line.

Although the prior art test devices work well for their intended purposes, they are not effective to test wire fault in an LAN. The ineffectiveness, in part, is due to the fact that the prior art test device cannot be integrated into the LAN.

SUMMARY OF THE INVENTION

It is therefore the main object and general purpose of the invention to provide a more efficient test device for testing the wiring system of an LAN.

The test device includes circuit for generating and supplying a low value dc currents into the conductors interconnecting a DTE with the main ring. Current measuring devices are provided to measure the current flow in the conductors. An imbalance current flow or excessive current flow is flagged as a wire fault condition.

In one feature of the invention the interconnecting conductors, from a DTE to the main loop, is interspersed with self-shorting connectors. The self-shorting connectors provide a current return path and ensures testability of the system even if the main loop is down.

The foregoing and other features and advantages of the invention will be more fully described in the accompanying drawings.

DETAILED DESCRIPTION OF THE PREFERRED EMBODIMENT

Figure 1:
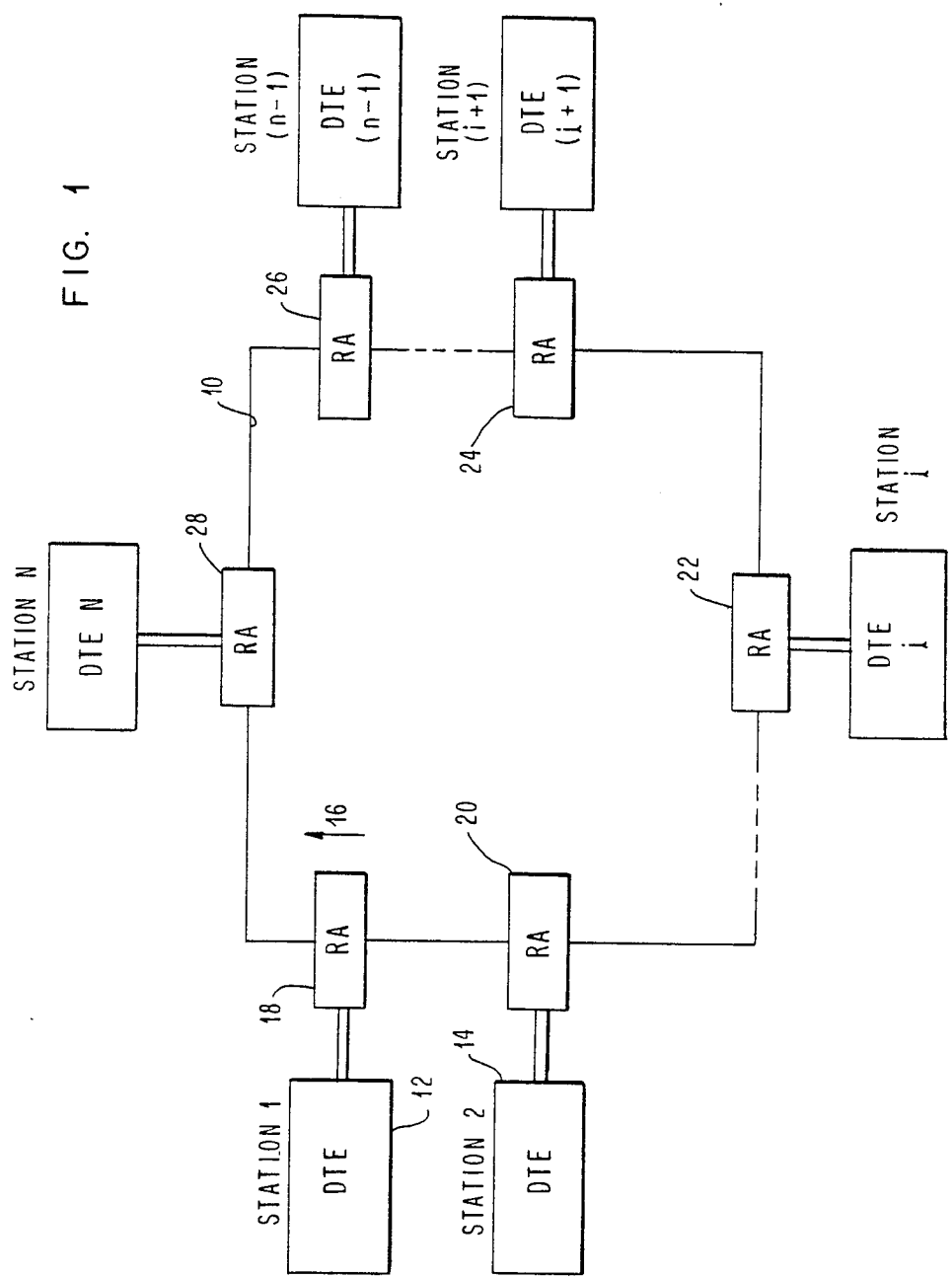
FIG. 1 shows a block diagram of a ring type Local Area Network. It depicts the environment in which the subject invention is used.

FIG. 1 shows a serial loop communication system in which the novel wire fault detecting system of the present invention may be employed. The serial ring communication system includes a closed loop unidirectional transmission ring identified by numeral 10. The ring interconnects a plurality of data terminal equipment (DTE) or data terminal units (DTU's) 12, 14, . . . i, i+1, . . . n−1 and n. Each data terminal unit may include one or several devices such as display terminals, microcomputers, data collectors, telephones, typewriters, etc. The function of the communication system is to exchange or distribute data between these devices. Data transmission in the system is unidirectional and may be in the direction shown by arrow 16. The data terminal equipment is connected to the ring by ring adapters 18, 20, 22, 24, 26 and 28 respectively. Each ring adapter is fitted with a wire concentrator (WC) whose function will be described hereinafter. The structure and function of the ring adapters are identical. Their purpose is to receive data from and transmit data onto the ring. To this end the ring adapter performs ring protocol functions which enable free movement of data on the ring without impacting the design of the data terminal equipment. The ring adapter and its connected data terminal equipment are referred to as a station. For example, station 2 includes data terminal equipment 14 and ring adapter 20, etc.

The communication system is reconfigurable. This means that if one of the stations is down the system can still function to transmit data between stations that are up or operating. The system is also mobile in that any of the data terminal equipment can be connected to any of the ring adapters. A more detailed description of the serial data communication system, FIG. 1, for illustrating the environment in which the invention may be practiced can be found in copending patent application entitled, "Method of Transmitting Information Between Stations Attached to a Unidirectional Transmission Ring," Ser. No. 326,291, now U.S. Pat. No. 4,482,999, filed by P. A. Janssen et al, and assigned to the same assignee of this application. The application is incorporated herein by reference.

Figure 2:
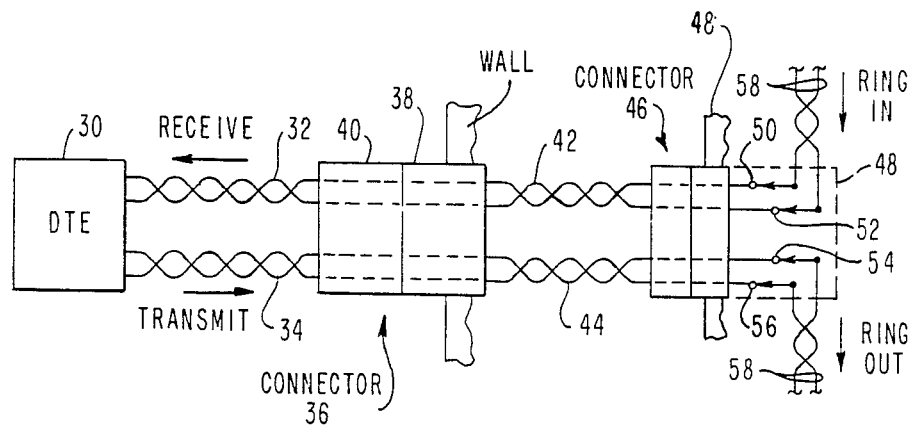
FIG. 2 shows a block diagram of the components which interconnect a DTE to the main ring.
Figure 3:
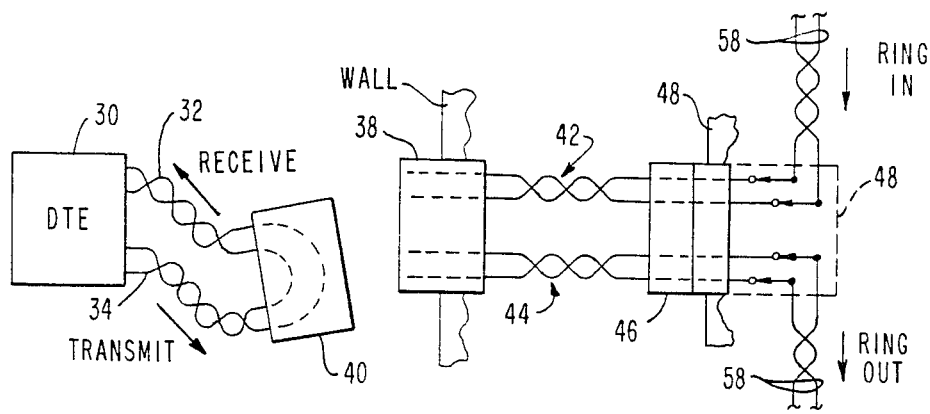
FIG. 3 shows the DTE in the so-called wraparound mode.
Figure 4:
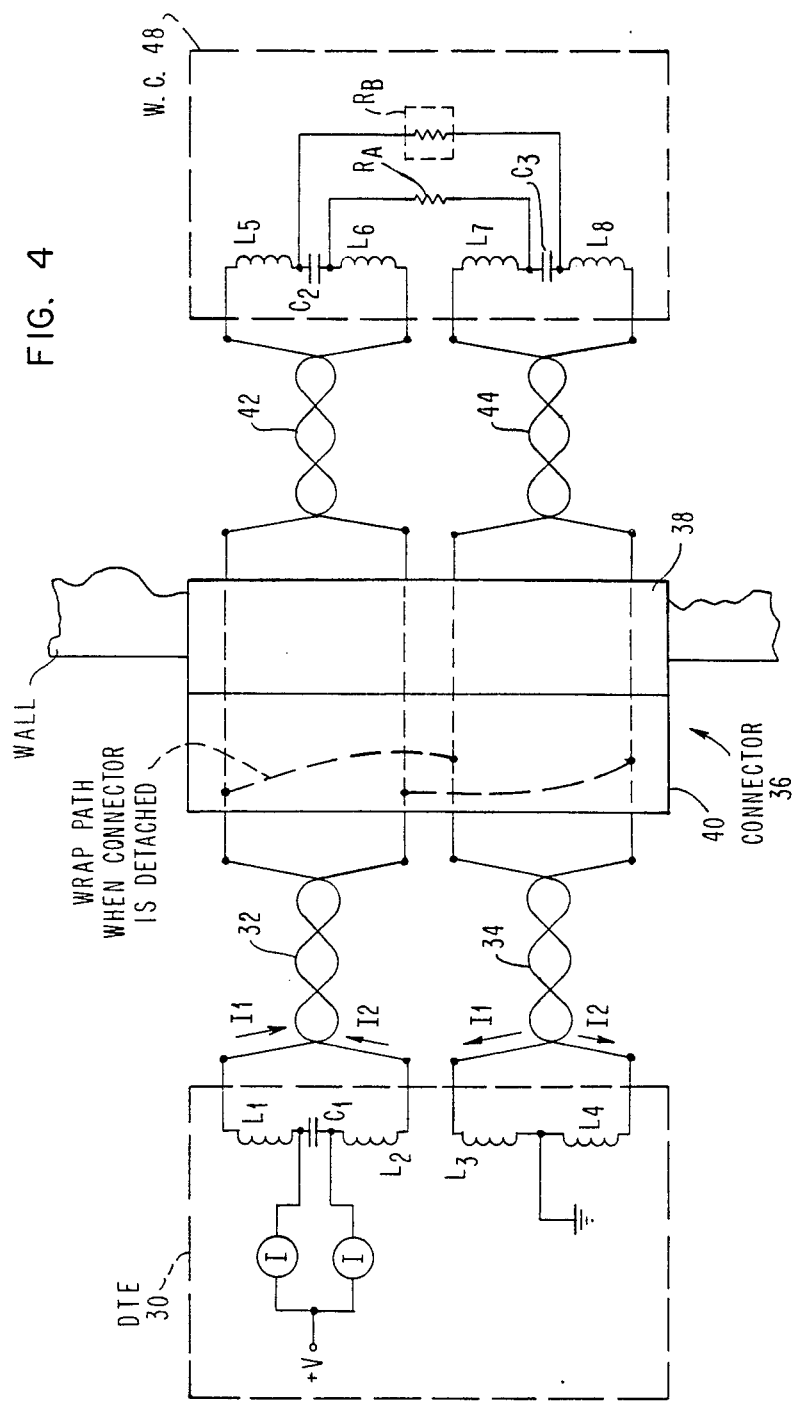
FIG. 4 shows a graphical representation of the wire fault detection circuit and the wiring topology for interconnecting the DTE to the main ring.

FIGS. 2, 3, and 4 show a wiring schematic between a station and the communication ring in FIG. 1. Since the wiring schematic for each of the stations in FIG. 1 is identical, only a single one will be used to describe the interconnection between the station and the communication loop. The function of the wiring schematic is to transmit electrical signals from/to the DTE over a communication means to a wall connector through another communication means to a connector and finally to a wiring concentrator (WC) where a mechanism (usually a relay) inserts or puts the DTE signal path in series with the main data ring. The signal path is then from the DTE around the serial ring and back to the DTE.

To this end, the DTE identified by numeral 30 (common numerals identify the same elements in FIGS. 2, 3 and 4) is connected by two pairs of twisted pair conductors 32 and 34 to a wall connector identified by numeral 36. Twisted pair conductor 32 transmits electrical signals generated in the DTE while twisted pair conductor 34 transmits electrical signals into the DTE. Electrical signals leaving the DTE are shown by the arrow caption "Transmit." Similarly, electrical signals into the DTE are shown by the arrow caption "Receive."

Wall connector 36 is comprised of a fixed section identified by numeral 38 and a pluggable portion identified by numeral 40. The fixed section is preferably connected to a wall while the pluggable section can be removed and inserted at any time. Preferably, connector 36 is of the self-shortening type. This means that when pluggable section 40 is not coupled to fixed section 38, the signal path is wrapped as is shown in FIGS. 3 and 4, respectively. Essentially, the signal transmitted from DTE 30 is fed over twisted pair conductor 32 through the wrap around path shown by broken line in pluggable section 40 and back into DTE 30 over twisted pair conductor 34. This condition occurs whenever pluggable section 40 is not plugged into fixed section 38. When this condition occurs, the attached DTE does not know whether the signals which are being transmitted and received are actually signals from the ring or wraparound signals from the wrap around path. The present invention to be described hereinafter detects this condition and reports it as an error condition. The invention detects this condition by sensing an overabundance of current in the transmit conductors. Still referring to FIGS. 2, 3 and 4, the fixed section 38 of wall connector 36 is connected by twisted pairs conductors 42 and 44, respectively, to pluggable connector 46. Pluggable connector 46 is also of the self-shortening type a wall connector 36 and is therefore susceptible to the same wrapping of signal problem if the connector is not plugged into wiring concentrator 48. The wiring concentrator performs part of the ring adapter (previously described in FIG. 1) function and is fitted with a mechanism preferably a relay arrangement (not shown) which closes contacts 50 through 56 (FIG. 2) and places the DTE signal path in series with the main data ring identified by numeral 10 (FIG. 1).

Preferably, the main data ring is fabricated from twisted pair conductors identified by numeral 58, FIGS. 2 and 3. The section of the ring entering the wire concentrator 48 is identified as ring IN with arrows representing the direction of signal flow while the section of the ring leaving the wire concentrator is identified as ring out with the arrow indicating the direction of the signal flow. With the above-described wiring topography, it is quite easy for a wire fault (break, short circuit, etc.) to occur at any point or junction of the wiring system. The present invention is to detect such wire faults and to report them to the device that monitors reliability, availability and serviceability functions in the network system.

FIG. 4 shows a more detailed view of the wire topology with a graphical representation of the wire fault detection circuitry. Several elements of FIG. 4 have already been described and for brevity those elements will not be described here. Only those elements of FIG. 4 which have not been described and are essential to the invention will be described. The wiring path over which wire fault can be determined begins at the DTE 30 and ends in the wire concentrator (W.C. 48). The twisted pair conductor 32 which carries signals from the DTE into connector 36 is connected to a voltage source plus V through inductors L1, L2 and capacitor C1. The inductors represent the secondary windings of data transformers. Similarly, signals into the DTE are carried over twisted pair conductors 34 and are sensed by inductor L3 and L4 respectively. Inductors L3 and L4 are center tap to ground. Similarly, conductors 42 and 44, respectively, are terminated into inductors L5, C2, L6, L7, C3, L8 RA and $R_B$. The capacitors $C_1$, $C_2$ and $C_3$ are isolating capacitors. The isolating capacitors prevent the direct current ($I_1$ and $I_2$) flowing in the respective wires of the twisted pair from combining. In other words, separate and distinct current paths must be provided for $I_1$ and $I_2$ respectively. In the preferred embodiment of the invention, $R_B$ represents a relay circuit arrangement which is provided to insert a DTE into the loop or the ring. As can be seen from the schematic in FIG. 4, the values of I1 and I2 are determined by $R_A$ and $R_B$, respectively. $R_A$ and $R_B$ include the resistance of the wire and the DTE drive characteristics etc. If $R_A$ and $R_B$ are equal in magnitude, then $I_1$ and $I_2$ are also equal in magnitude.

Preferably, the values of $R_A$ and $R_B$ are sufficiently high to keep the currents I1 and I2 less than 1 milliamp. The invention therefore incorporates measuring mechanism I which measure currents ($I_1$ and $I_2$) generated from $+V$ voltage supply. By comparing the currents for equality, the DTE can ascertain if the wiring paths to the W.C. 48 contain open circuit condition or short circuit condition. Once a current imbalance is detected, an indication is sent to the control logic (not shown) as a wire fault signal. Likewise, if the amount of current in the wires exceeds a predetermined amount, this indicates that a wrap condition exists between the DTE and the wire concentrator. As stated earlier, the wrap condition may occur at the wall connector and/or the W.C. connector.

Figure 5:
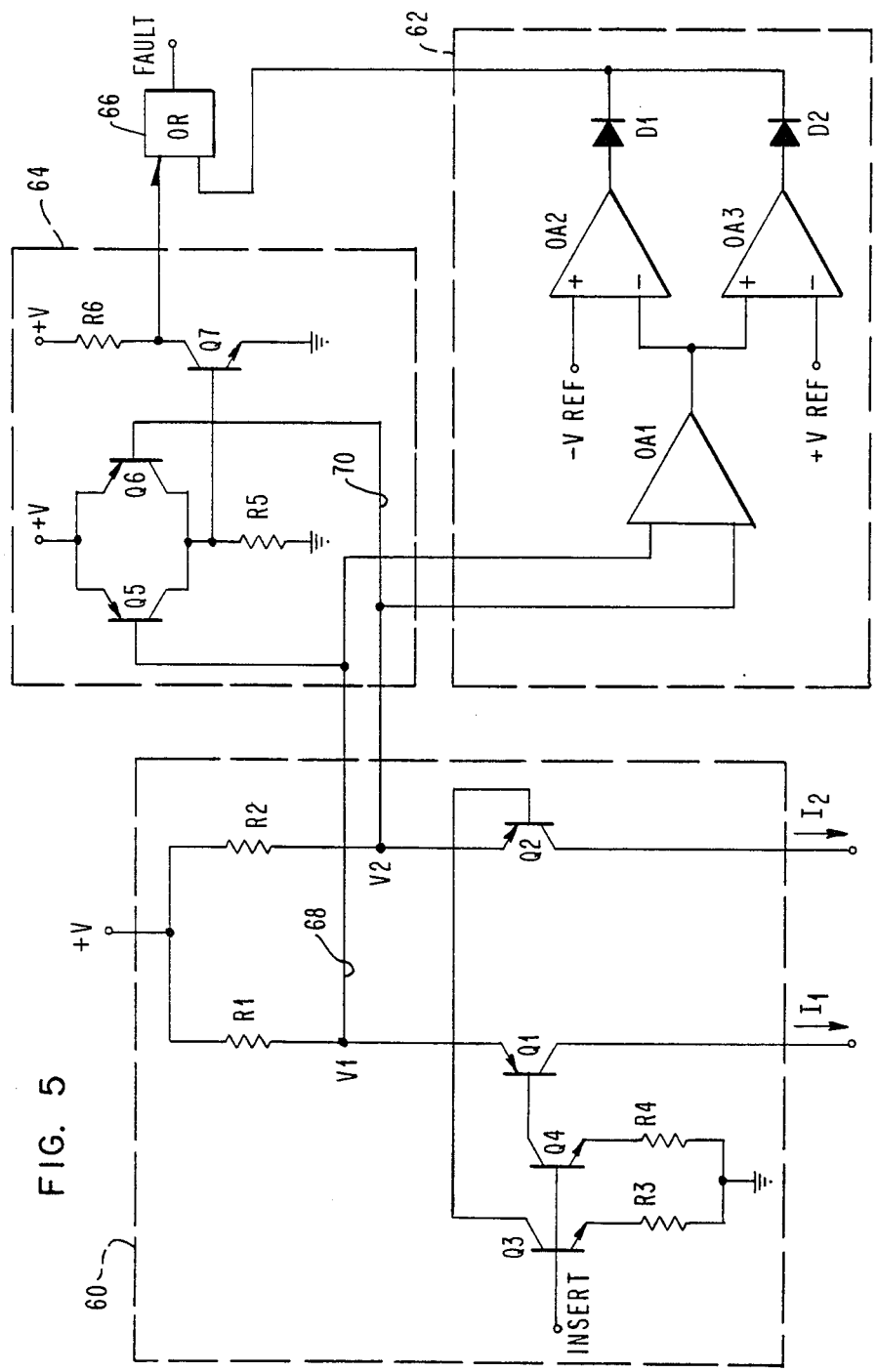
FIG. 5 shows a representation of the wire fault detection circuit according to the teaching of the present invention.

Referring now to FIG. 5, there is shown an electrical circuit for measuring the currents I1 and I2 respectively. The circuit includes a current generating means 60, an over current detection means 64, a current measuring imbalance means 62, and an error signal generating means 66. The current generating means 60 consists of transistors Q3, Q4 and Q1. The transistors are coupled in tandem and the emitters of transistors Q3 and Q4 are coupled through resistors R3 and R4 respectively to ground. The collector of transistor Q1 is connected to one of the twisted pairs wire which forms twisted pair conductors 32 (FIG. 4). The current I1 is generated from the collector of transistor Q1. The emitter of transistor Q1 is connected through resistor R1 to a positive voltage supply +V. The positive voltage supply (+V) is relatively low voltage, usually +5 V. A variable reference voltage source V1 is defined at the junction where a wire identified by numeral 68 intersects the wire connecting the emitter of Q1 to positive voltage supply +V through R1. Current $I_1$ flows in one of the conductors or wires that forms twisted pair conductors 32 (FIG. 4).

As will be explained subsequently, it is this variable reference voltage V1 that is used to determine when an overcurrent condition occurs in current I1. A similar voltage $V_2$ (to be described subsequently) is used to determine when an excessive current condition exists in current $I_2$. The other section of current generating means 60 comprises of transistor Q2 whose base is tied to the collector of transistor Q3 and whose emitter is tied through R2 to +V. The collector from transistor Q2 is the source of current I2. Current I2 flows in the other wire that forms twisted pair conductors 32 (FIG. 4).

As with V1, a second variable reference voltage V2 is provided in the emitter of Q2 and is coupled over conductor 70 into overcurrent detection means 64. The overcurrent detection means 64 comprises of transistors Q5, Q6 and Q7 respectively. The collector of transistors Q5 and Q6 are coupled through R5 to ground while the emitters of Q5 and Q6 are tied to +V voltage supply. The base electrodes of Q5 and Q6 are tied to variable reference voltages V1 and V2 respectively. The base of Q7 is tied through R5 to ground. The emitter of Q7 is tied to ground while the collector is coupled through resistor R6 to a +V supply. The collector conductor of Q7 is also connected to one input of "OR" circuit 66. As will be explained subsequently, the output from "OR" circuit 66 generates a fault signal at the occurrence of an overcurrent or imbalance current condition.

The current measuring imbalance means 62 comprises of operational amplifiers OA1, OA2, OA3, and diodes D1 and D2, respectively. The inputs into operational amplifiers OA1 are taken from variable reference voltages V1 and V2 respectively. The output from OA1 is fed into the negative and positive terminals of OA2 and OA3 respectively. A +V (reference) signal is applied to the negative terminal of OA3 while a −V (reference) signal is applied to the plus terminal of OA2. The signal −V reference and +V reference is the maximum range within which the currents I1 and I2 can differ. The currents from the op amp OA2 and OA3 are fed through D1 and D2 into the other input terminal of the "OR" circuit means 66. The output from the "OR" circuit means forms a fault or error signal which is forwarded to the RAS controller (not shown) of the ring. It should be noted that although a specific implementation of the circuit is described it is within the scope of this invention to vary the circuit without departing from the scope and spirit of the present invention.

In operation, two independent currents (I1 and I2) are provided to the twisted wire media pair 32. The currents are provided by Q1 and Q2 from +V through R1 and R2, respectively. A positive voltage on the bases of Q3 and Q4 will turn on Q1 and Q2 allowing I1 and I2 to flow. The relative magnitudes of these currents are determined by the load $R_A$ and $R_B$ (FIG. 4). In addition, $R_B$ includes the resistance caused by a relay activation circuit arrangement. Similarly, $R_A$ includes the resistance caused by a load balancing resistor. As stated before, with $R_A = R_B$, $I_1$ and $I_2$ are equal. If a normal condition exists, I1 and I2 are nearly equal at approximately 1.2 milliamps. It should be noted that under this condition the voltage drop across R1 and R2 will be equal, hence, V1 and V2 are substantially the same value. Two circuits 64 and 62 respectively monitor these voltages. One of the circuits 64 looks for V1 or V2 to drop below approximately 1 $V_{be}$ transistor junction voltages (0.7 volts) below +V. The other circuit 62 detects whether the difference between I1 and I2 is greater than about 0.4 milliamps. The first circuit 64 consists of Q5 and Q6 which drives Q7 if V1 or V2 drops 0.7 volts below +V. This will occur if more current is drawn from Q1 or Q2 than is allowed. Q7 drives one input of the OR circuit indicating fault.

The second sense circuit 62 consists of OA1, OA2, OA3 and diodes D1 and D2. OA1 amplifies the difference voltage (V1−V2). The difference in voltage represents the difference in current between I1 and I2. A window comparator consisting of OA2 and OA3 detects whether this difference is out of the design bounds set by $+V_{ref}$ and $-V_{ref}$. If imbalance is out of range (indicating an open or short on one of the media wires) OA2 or OA3 drives current into D1 or D2 activating the other "OR" input thereby generating a "Fault" signal.

While the invention has been particularly shown and described with reference to a preferred embodiment thereof, it will be understood by those skilled in the art that various changes in form and details may be made therein without departing from the spirit and scope of the invention.

Having thus described our invention, what we claim as new, and desire to secure by Letters Patent is:

1. An apparatus for testing and detecting wire faults in a local area network comprising:
   a first circuit means operable to generate a pair of reference voltages;
   electrical load means operable to control the magnitude of the reference voltages;
   electrical conductor means operable to interconnect each of the reference voltages to the electrical load means; and
   circuit means operable positioned for monitoring the reference voltages and to generate an error signal in the event that the magnitude of current flow in the conductor means exceeds a predetermined value.

2. The apparatus of claim 1 wherein the conductor means includes a twisted pair of wire conductors.

3. The apparatus of claim 1 wherein the load means includes a magnetic latching relay drive circuit.

4. In a local area network having a looped communication ring, at least one wire concentrator adapted for inserting at least one data terminal equipment into said ring and electrical conductor means for interconnecting the DTE to the wire concentrator; a method for testing for wiring fault in said network comprising of the following steps:
   (a) generating two d.c. electrical currents;
   (b) transmitting the electrical currents through the conductor means;
   (c) monitoring the current for current imbalance condition and/or excessive current condition;
   (d) generating an error signal at the occurrence of the current imbalance condition and/or excessive current condition; and
   (e) utilizing the error signal to indicate a wire fault.

5. In a local area network having a main communication loop, at least one wire concentrator adapted to insert at least one DTE into said loop; a pair of twisted electrical conductors adapted for interconnecting the DTE to the wire concentrator, an apparatus for in situ testing of wiring faults, said apparatus comprising in combination:
   two first circuit means operable to generate a relatively low value d.c. current;
   a conduction means including the pair of twisted electrical conductors operable for conducting the d.c. currents;
   electrical means operable for monitoring the current in each of the electrical conductors for current imbalance and/or excessive current; and
   means operable for generating an error signal representative of a wiring fault at the occurrence of the current imbalance and/or the excessive current.

6. In a network having a main communication loop, at least one wire concentrator adapted for inserting at least one DTE into said loop; a pair of twisted electrical conductors adapted for interconnecting the DTE to the wire concentrator, an apparatus for in situ testing of wiring faults, said apparatus comprising in combination:
   a first circuit means operable to generate two relatively low value independent currents;
   circuit means operable for receiving the currents and for generating a pair of reference voltages therefrom;
   conduction means including the pair of twisted electrical conductors operable for conducting the currents;
   a connector means having self-shorting current characteristics operable for coupling the current from the conduction means into the wire concentrator;
   electrical circuit means operable for monitoring the reference voltages to detect current imbalance and/or excessive current; and
   means operable for generating an error signal representative of a wiring fault at the occurrence of the current imbalance and/or the excessive current.

7. An apparatus for testing and detecting faults in a local area network wherein said network is being formed from two twisted wire pairs configured into a d.c. current loop comprising:
   a first circuit means coupled to said twisted wire pairs and operable for generating a pair of variable reference signals;
   electrical load means coupled to each of the twisted wire pairs and operable for controlling the magnitude of the signals;
   a current measuring imbalance means operable for monitoring the pair of variable reference signals and for generating a first error signal if a current imbalance condition is being detected in any wire of the twisted wire pairs; and
   an overcurrent detection means operable for monitoring the pair of variable reference signals and for generating a second error signal if current flowing in any wire of the twisted pairs falls outside of a predetermined range.

8. The apparatus of claim 7 wherein the first circuit means includes a first transistor having an emitter conductor, a base conductor and a collector conductor;
   a second transistor having a base conductor, an emitter conductor and a collector conductor with the base conductor of said second transistor being connected to the base conductor of the first transistor;
   a first resistor interconnecting the emitter conductor of the first transistor to a ground potential;
   a second resistor interconnecting the emitter conductor of the second transistor to a ground potential;
   a first current generating means operable coupled to the first transistor;
   a second current generating means operable coupled to the second transistor;
   a voltage supply means;
   a third resistor interconnecting the first current generating means and the voltage supply means; and
   a fourth resistor interconnecting the second current generating means and the voltage supply means.

9. The apparatus of claim 7 wherein the current generating means includes a transistor.

10. The apparatus of claim 7 wherein the current measuring imbalance means includes a first operation amplifier having a single output lead and inverting and non-inverting input leads;
   a second operational amplifier having an inverting input lead being connected to the single output lead and a positive input lead being connected to a negative voltage reference signal;
   a third operational amplifier having a non-inverting input lead being connected to the single output lead and an inverting input lead being connected to a positive voltage reference signal;
   a first diode being connected to an output lead of the second operational amplifier; and
   a second diode being connected to an output lead of the third operational amplifier.

11. The apparatus of claim 7 wherein the overcurrent detection means includes a positive voltage supply means;
   a first switching means having a plurality of control leads;
   a second switching means having a plurality of control leads said first and second switching means having one each of the plurality of control leads being connected to the positive voltage supply;
   a third switching means having a plurality of control leads with one of said leads being connected to the first and second switching means and another of said leads being connected to a ground potential;
   a resistive means interconnecting one each of the plurality of leads from the first and second switch means to a ground potential; and a second resistive means interconnecting a third lead of the third switching means to the positive voltage supply.

12. The apparatus of claim 11 wherein the switching means includes transistors.

13. A circuit arrangement for detecting error conditions in the wiring installation of a communications network comprising:

a first circuit means coupled to said wiring installation and operable for generating reference signals with the reference signals being responsive to currents flowing in the wiring installation;

an overcurrent detection means operable for monitoring the reference signals and for generating an error signal if current flowing in the wiring installation falls outside of a predetermined range; and a current measuring imbalance means operable for monitoring the reference signals and for generating an error signal if a current imbalance condition is being detected in the wiring installation.

14. The circuit arrangement of claim 13 wherein the reference signals include a pair of voltages.

* * * * *